United States Patent [19]

Precious et al.

[11] Patent Number: 5,320,274

[45] Date of Patent: Jun. 14, 1994

[54] NON-OXIDIZING SOLDERING CHAMBER WITH SHAPED CURTAIN AND METHOD OF SOLDERING

[75] Inventors: Colin J. Precious, Moortown, England; Raymund Thomas, West Glamorgan, Wales

[73] Assignee: The BOC Group plc, Windlesham, United Kingdom

[21] Appl. No.: 954,768

[22] Filed: Sep. 30, 1992

[30] Foreign Application Priority Data

Oct. 3, 1991 [GB] United Kingdom ............... 9121003

[51] Int. Cl.$^5$ ............................................ B23K 3/00
[52] U.S. Cl. ............................ 228/37; 228/180.1; 228/219; 432/250
[58] Field of Search ............... 228/180.1, 219, 37; 432/242, 250; 219/388, 390

[56] References Cited

U.S. PATENT DOCUMENTS

| | | | |
|---|---|---|---|
| 4,580,716 | 4/1986 | Barresi et al. | 228/219 |
| 4,838,476 | 6/1989 | Rahn | 228/180.1 |
| 4,921,156 | 5/1990 | Hohnerlein | 228/37 |
| 5,161,727 | 11/1992 | Leturmy et al. | 228/37 |

FOREIGN PATENT DOCUMENTS

| | | |
|---|---|---|
| 0440264 | 10/1988 | European Pat. Off. |
| 3843191 | 12/1988 | Fed. Rep. of Germany |
| 63-174778 | 7/1988 | Japan ..................... 228/219 |
| 91/08855 | 6/1991 | PCT Int'l Appl. .......... 228/219 |

OTHER PUBLICATIONS

Patent Abstract of Japan, vol. 6, No. 26 (M-112) Feb. 16, 1982 & JP-A-56 144 860 (Fuji Electric Co Ltd) Apr. 14, 1980; "Conveyor Furnace".

*Primary Examiner*—Paula A. Bradley
*Assistant Examiner*—Jeanne M. Elpel
*Attorney, Agent, or Firm*—David M. Rosenblum; Larry R. Cassett

[57] ABSTRACT

A soldering apparatus includes a conveyor adapted to carry assembled circuit boards through a soldering chamber. A wave of solder is created in the chamber. The chamber has a curtain at its entrance and a curtain at its exit. Gas distributors are located within the chamber and are able to introduce nitrogen into the chamber in order to create a non-oxidizing atmosphere in the vicinity of the wave. In operation, the wave of solder wets connecting points between the components and the board to form permanent joints on solidification of the solder. The bottom edge of the curtain is of a shape complementary to the front elevation of the assembled circuit boards to be soldered and is arranged such that the circuit boards just pass thereunder without making contact with it.

15 Claims, 4 Drawing Sheets

NON-OXIDIZING SOLDERING CHAMBER WITH SHAPED CURTAIN AND METHOD OF SOLDERING

BACKGROUND OF THE INVENTION

This invention relates to a method and apparatus for soldering. It is particularly concerned with the manufacture of circuit boards.

The manufacture of circuit boards is a well known industrial operation. Typically, electrical circuits are printed onto a board, and holes are drilled in the board at chosen locations to enable chosen circuit components to be inserted and to be soldered to electrical conductors on the board. The soldering operation is typically performed automatically or semi-automatically. Boards to be soldered are loaded in sequence onto a conveyor which advances them through an elongate chamber housing a soldering station. The soldering therefore takes place as the boards are advanced through the chamber.

There are two commercially important methods of soldering: reflow soldering and wave soldering. In fellow soldering, miniature electronic components are surface mounted on a printed circuit board to which a solder in a creamy or paste-like consistency has been applied by a method such as screen printing, stencilling or dispensing. The printed circuit board is then subjected to a sufficiently high temperature, generally 50° C. greater than the melting point or liquidus of the solder alloy, to cause the alloy to liquery and to contact the components such that upon subsequent cooling of the printed circuit board, the components remain secured in place on the board by the solder. The heat can be supplied by, for example, infrared, vapour phase, heated conveyor belt or convective means. The solder conventionally comprises a soft powdered metal alloy dispersed in a liquid medium containing a flux, an organic solvent and a thickening agent selected to impart the desired consistency to the mixture.

Have soldering differs from reflow soldering in that the solder is not applied to the board in advance of the board's being carried through the soldering chamber. Instead, a vessel containing molten solder is located within the chamber and is arranged in conjunction with a pump to create a wave or waves of the solder. The circuit boards are each advanced through the soldering chamber in such spaced relationship to the wave or waves that appropriate amounts of solder are applied, as desired, to the components and that suitable solder joints are formed on cooling the boards. Typically, the boards are pre-treated with a flux at desired locations so that the solder is able to adhere to the surface at these locations.

In recent years, considerable research and development activity has been focused on optimizing the atmosphere in which the soldered joints are formed. In, for example, conventional wave soldering, the molten solder is oxidized when exposed to molecules of oxygen. The oxidized solder tends to form a surface oxide layer which is removed typically by a flux applied to the board before it is passed into the soldering chamber. Removal of the oxide enables the solder to wet the components to be soldered. Since the wave has a surface layer of molten solder which is continuously broken, a residue of oxide and solder, known as dross, collects within a vessel in which the solder is contained. Dross generation adds considerably to the cost of the wave soldering process owing to the lost value of the solder and the maintenance requirements it imposes. For example, it is necessary from time to time to remove dross from the vessel and to repair mechanical parts of the wave soldering apparatus damaged by its abrasive action. In addition, the dross itself can be a health hazard if the solder contains toxic components such as lead.

It has accordingly been proposed to blanket the entire surface of the wave with an atmosphere which is less reactive than air towards the solder. There is, however, a body of teaching in the art which requires the presence of oxygen in the soldering atmosphere. In particular, U.S. Pat. No. 4, 610,391 relates to an improvement in a process for wave soldering a workpiece in an atmosphere consisting essentially of air wherein (i) there is a first portion of the solder wave in which fluid motion can be observed, said first portion including an active dross forming area, and (11) there is a second portion of the solder wave which is the last portion of the solder wave with which the workpiece comes into contact. The improvement comprises replacing the atmosphere in contact with at least 50% of the surface of the active dross forming area with an inert gas, but preventing the atmosphere in contact with the surface of the second portion from becoming inert. Typically, two gas diffusers are employed. A first gas diffuser supplies an inert gas such as nitrogen to the front of the wave. A second gas diffuser applies a gas mixture typically containing from 18 to 50% by volume of oxygen (a balance typically being nitrogen) to the rear of the wave.

In EP-A-361 507, it is disclosed that in the presence of a soldering flux it is desirable to maintain an oxygen concentration in the range of from about 10,000 to 20,000 parts by volume per million in the vicinity of the solder wave. EP-A-0 330 867 discloses that this oxygen concentration can be as low as 10 parts by volume per million in a wave soldering process which employs no pre-treatment of the circuit boards or other components with flux.

EP-A-0 389 218 discloses that reflow soldering may be carried out in a low oxidizing atmosphere, preferably one containing no more than 1500 parts per volume per million of oxygen.

Notwithstanding the teaching in EP-A-0 330 867 A that wave soldering can be conducted without the pre-treatment of the printed circuit board with flux when the soldering atmosphere contains in the order of 10 parts by volume per million of oxygen, manufacturers still prefer to pre-treat the circuit boards with flux. The reasons are two-fold. First, difficulties arise in reliably and repeatedly being able to maintain in the soldering chamber an atmosphere having an oxygen concentration as low as 10 parts per million by volume even if, say, a source of substantially pure nitrogen (containing no more than 5 volumes per million of oxygen) is used to create the soldering atmosphere. Secondly, it is still found that some dross is formed even in low oxygen environments.

Although soldering flux is able to cater for the presence of oxygen in a soldering atmosphere, we nonetheless believe that there is a need to keep down the ingress of air into the soldering atmosphere. It is known to provide curtains at both the entrance to and exit from a soldering chamber in order to limit the ingress of air. Such curtains form a physical barrier to the ingress of air when nitrogen is supplied to the interior of the chamber. The curtains typically each comprise a number of fingers or filaments of rubber, thin metal sheet or glass fibres. The curtains typically totally obturate the entrance and exit to the chamber but are able to be displaced by advancing circuit boards to permit their entry to and exit from the chamber. We have surprisingly found that contact between such curtains, even though they are lightweight, and boards passing into the soldering chamber can displace some components sufficiently to impair their soldering and hence the quality of the finished circuit board. Although this problem can be overcome, by removing the curtains and increasing the flow of nitrogen used to form the soldering atmosphere, this practice leads to an undesirably high consumption of nitrogen if it is desired to maintain low oxygen concentrations within the soldering atmosphere. Me further believe that it is desirable to maintain a soldering atmosphere having a low oxygen concentration even if the boards are pre-treated with a soldering flux.

There is therefore a need in the art for an improved method and apparatus for soldering which facilitates the creation of soldering atmospheres containing only low levels of oxygen, but which overcome the above-described problem that arises with conventional curtains. The invention aims at meeting this need.

SUMMARY OF THE INVENTION

According to the present invention there is provided a method of soldering, including the steps of advancing circuit boards (or other workpieces) to be soldered through a soldering chamber having an entrance and an exit, supplying non-oxidizing gas to the soldering chamber to create therein a relatively non-oxidizing soldering atmosphere, and providing a door or curtain at the chamber entrance and at the chamber exit, characterized in that the boards (or other workpieces) advance through the entrance to the chamber without making contact with the door or curtain provided there.

The invention also provides a soldering apparatus including a soldering chamber having an entrance and an exit, a conveyor for conducting circuit boards to be soldered through the chamber, an inlet for non-oxidizing gas whereby a relatively non-oxidizing atmosphere can be created in the vicinity of where, in operation, the soldering is performed, a door or curtain at the exit from the chamber and a door or curtain at the entrance to the chamber, the doors or curtains being arranged so as to limit the ingress of air into the chamber, characterized in that the door or curtain at the entrance to the chamber is shaped or operable such that, in use, circuit boards or other workpieces to be soldered enter the chamber without contacting the door or curtain at the entrance.

By the term "relatively non-oxidizing atmosphere" we mean an atmosphere which is less oxidizing than air to the solder. It is preferred that the relatively non-oxidizing atmosphere contains no more than 200 volumes per million of oxygen. By the term "non-oxidizing gas" as used herein is meant a gas or gas mixture containing a concentration of oxygen impurity lower than that of the relatively non-oxidizing atmosphere.

The method and apparatus according to the invention are particularly suitable for use in wave soldering especially when the circuit board includes soldered joints that have previously been made by reflux soldering. They are also suitable for use for fellow soldering.

Contact between a door at the chamber entrance and a circuit board entering the chamber can be avoided by providing the apparatus according to the invention with means for detecting the position of a circuit board about to enter the chamber, such means being operatively associated with means for raising or otherwise opening the door so as to permit entry without there being contact between the door and the circuit board, and with means to lower (or otherwise close) the door, or to allow such lowering to take place, once the board has passed through the door.

It is, however, preferred to provide a door or curtain at the chamber entrance with a bottom edge of shape generally complementary to the profile (i.e. front elevation) of an assembled circuit board to be soldered, whereby the circuit board is able to pass under the bottom edge without contacting the door or curtain. Preferably, the position and height of the curtain or door at the entrance to the chamber is such that the shaped bottom edge clears the assembled circuit board by less than 5 mm. Accordingly, the rate of ingress of air beneath the bottom edge into the chamber is low compared with a chamber without any door or curtain at its entrance. It is therefore possible to maintain a low concentration of oxygen in the atmosphere in the vicinity of where the solder is applied to the boards in the chamber of a wave soldering apparatus without there being a requirement for an excessive rate of introduction of nitrogen or other non-oxidizing gas into the chamber.

Preferably, when wave soldering in accordance with the invention, before passing the boards into the chamber, each circuit board has a soldering flux applied to it in the locations where the soldered joints are to be made. A conventional soldering flux may be used (e.g. a MULTICORE soldering flux) and it may be applied by conventional techniques. Even if such a soldering flux is so applied, it is preferred that the concentration of oxygen in the vicinity of the wave or waves created in the chamber is kept below 100 parts per million by volume and more preferably below 50 parts per million by volume. In order to achieve such low levels of oxygen in the soldering region, it is desirable to employ a suitable high purity source of nitrogen. Typically, a modern commercial plant for the separation by rectification of nitrogen from air produces a product containing no more than 5 volumes per million of oxygen impurity which is suitable for use as the source of nitrogen in the method according to the invention.

By employing the method according to the invention with nitrogen as the non-oxidizing gas, we have achieved soldering atmospheres containing no more than 50 volumes per million of oxygen in the region of the solder wave with a total nitrogen flow rate of not more than 250 chamber volumes per hour.

Although the non-oxidizing gas is preferably nitrogen, it is alternatively possible to use a noble gas, for example, argon. Another alternative non-oxidizing gas at soldering temperatures (which are typically below 250° C.) is carbon dioxide.

Non-oxidizing gas introduced into the chamber in the vicinity of the wave or waves of solder desirably has insufficient velocity to impair the formation of the soldered joints. Accordingly, it is preferred that such non-oxidizing gas be introduced through a diffuser having a multiplicity of microscopic gas distribution pores.

Non-oxidizing gas may be introduced into the chamber at locations spaced apart from the immediate vicinity of where the solder is applied. If it is desired to keep the concentration of oxygen to particularly low levels in the vicinity of the waves, say to less than 40 ppm by volume of oxygen, then it is desirable to supply non-oxidizing gas within the chamber at a location near the entrance door or curtain and at a location near the exit door or curtain. Moreover, we have surprisingly found that in commercial wave soldering apparatus, some of the soldered joints are not completely solid when each board leaves the furnace. Accordingly, components may be displaced as each board passes through the outlet door or curtain if there is physical contact between the components and the door or curtain. There are two alternative solutions to this problem. The first solution is to prevent contact between the outlet door or curtain and each circuit board leaving the chamber. Accordingly, the exit door or curtain may be arranged in the same manner as the entrance door or curtain. Alternatively, a stream or streams of non-oxidizing gas, for example nitrogen, can be directed at the soldered joints so as to provide additional cooling for them at a region of the chamber intermediate the solder wave or waves and the exit therefrom.

It is possible to adapt a conventional soldering chamber for use in a method according to the invention by means of relatively simple modifications including the installation of suitable curtains.

The method and apparatus according to the invention make possible the formation of sound soldered joints with only a relatively low concurmittent formation of dross.

BRIEF DESCRIPTION OF THE DRAWINGS

Methods and apparatus according to the invention will now be described by way of example with reference to the accompanying drawings, in which.

DETAILED DESCRIPTION

Figure 1A:
FIGS. 1A to 1E are schematic drawings illustrating the preparation of a circuit board for wave soldering.

Referring to the drawings, in FIG. 1A there is shown a substrate 2 from which a circuit board is able to be made. The substrate 2 is of suitable insulating material for example glass fibre or paper impregnated with a phenolic resin.

Figure 1B:
Figure 1C:
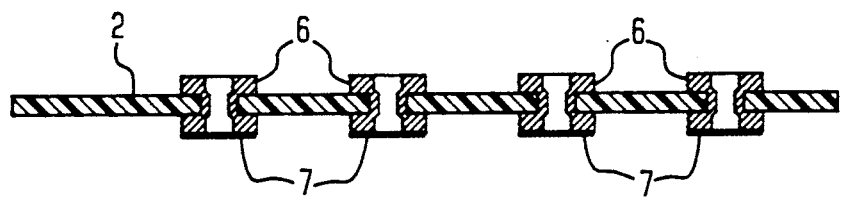
Figure 1D:
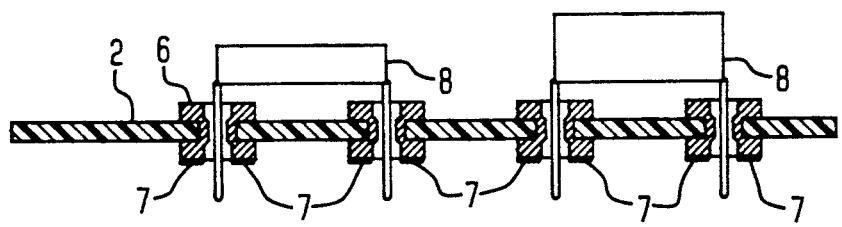

Referring to FIG. 1B, apertures 4 are then drilled in the substrate 2 at locations where it is desired to insert electrical components. The substrate 2 is then copper plated to provide appropriate conductors for the electrical circuit that is to be formed (see FIG. 1C). In particular, copper plating 6 is provided through and in the vicinity of each aperture 4. A suitable soldering flux 7 (e.g. TAMURA or MULTICORE flux) is then provided on the surfaces of the copper plating 6. Electrical components 8, for example, resistors, capacitors and/or inductances, are then inserted through the holes 4, as illustrated in FIG. 1D. The thus assembled circuit board is then subjected to wave soldering in order to form soldered joints in the positions 10 as shown in FIG. 1E.

Figure 1E:
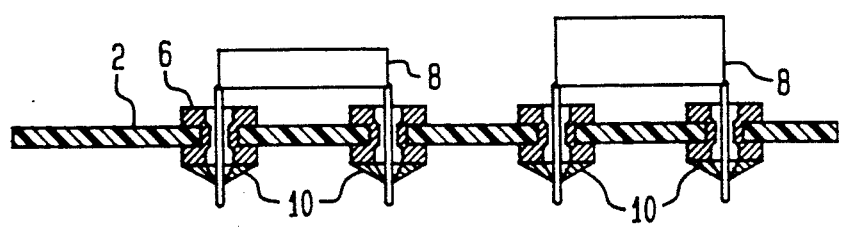
Figure 2:
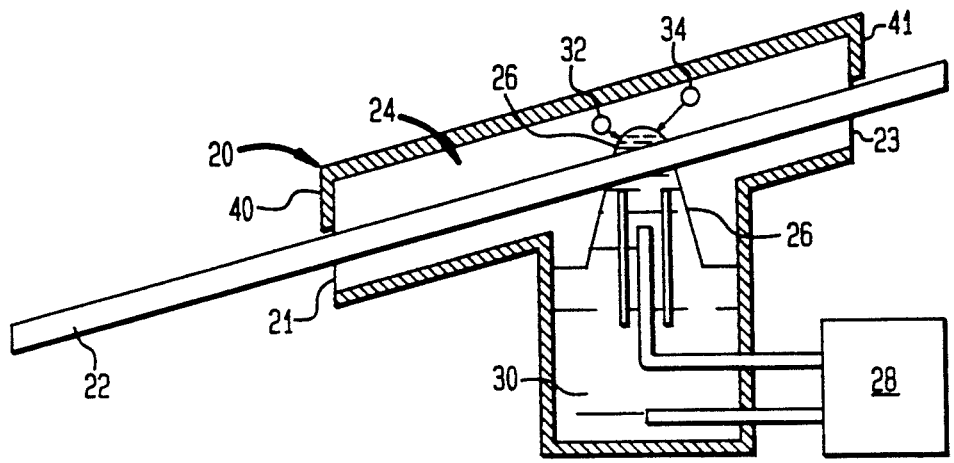
FIG. 2 is a schematic side view of wave soldering apparatus according to the invention.

The wave soldering of boards as shown in FIG. 1E is conducted in an apparatus as shown in FIG. 2. This apparatus typically comprises a conventional wave soldering "machine" of a kind that is commercially available, for example, a machine sold under the Trademark EUROPAK, with certain modifications regarding the provision of curtains at the entrance and exit and the provision of means for introducing nitrogen into the soldering chamber.

Referring to FIG. 2, the illustrated soldering apparatus 20 includes a conveyer 22 adapted to carry assembled circuit boards (not shown in FIG. 2) through a soldering chamber 24. The arrangement is such that a wave 26 of solder wets connecting points between the component and the board to form a permanent joint on solidification of the solder. Any conventional solder may be used. It typically comprises an alloy of tin and lead (for example a solder sold under the Trademark MULTICORE Non Eutectic). The wave 26 is created by a suitable pumping means 28 which is preferably located within a vessel 30 for holding a volume of molten solder. Heating means (now shown) may be provided in the vessel 30 to maintain the solder in tool ten state. The pumping means 28 may take the form of an Archimedean screw.

Figure 4:
FIG. 4 is a schematic view (from below) of a gas distributor for use in the apparatus shown in FIG. 2.

Gas distributors 32 and 34 are located within the chamber 24 for creating a non-oxidizing atmosphere in the vicinity of the wave. The distributor 32 is an elongate, hollow member extending within the chamber 24 generally transversely to the longitudinal axis thereof and has a lower face of porous material through which non-oxidizing gas, for example, nitrogen, supplied from a source thereof is able to diffuse. The distributor 32 is typically positioned over a forward portion of the solder wave 26. The distributor 34 is preferably also an elongate hollow member. As shown in FIG. 4 it has a row of gas distribution orifices 38 in its lower face 36. The distributor 34 is positioned rearwardly of the wave 26 and the orifices 38 face the circuit boards as they pass underneath it. In operation, the distributors 32 and 34 are connected to a source of non-oxidizing gas such as nitrogen and is able to provide nitrogen to the interior of the chamber 24 and assist in creating a relatively non-oxidizing atmosphere in the vicinity of the solder wave 26. In addition, the distributor 34 directs streams of non-oxidizing gas in a downward direction at the soldered components which help to cool such components. The distributor 34 is shown in FIG. 2 as being positioned intermediate the solder wave 26 and the exit 23 of the chamber 24. The distributor 34 may alternatively be positioned over the wave 26.

Figure 3:
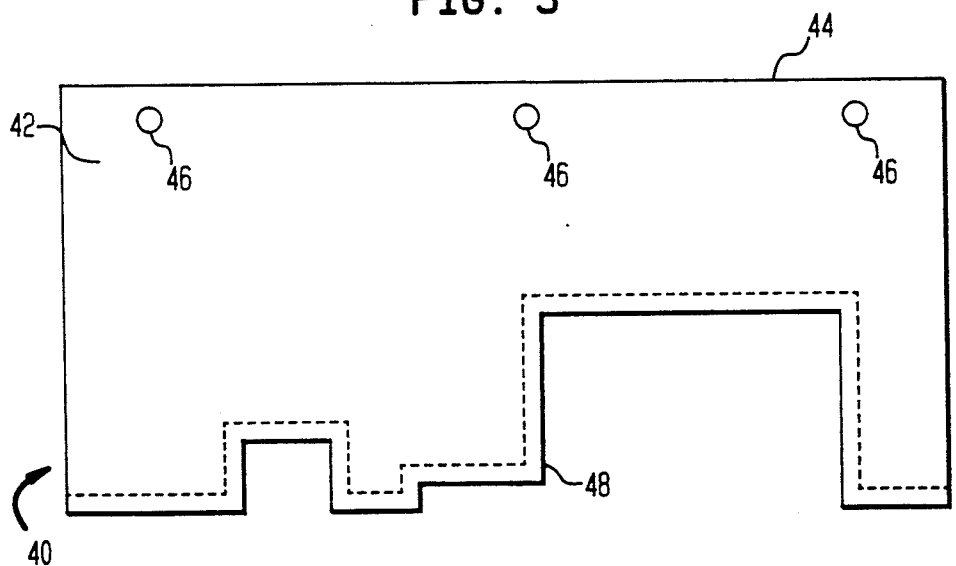
FIG. 3 is a schematic front elevation of a curtain for use in the apparatus shown in FIG. 2.

In order to limit the ingress of air into the soldering chamber 24 through entrance 21 and exit 23 thereof, a curtain 40 is provided at the entrance 21 and a curtain 41 at the exit 23. The curtain 40 is shown in FIG. 3 of the accompanying drawings. The curtain 40 comprises a thin plate or lamina 42 having adjacent its upper edge 44 apertures 46 to enable it to be bolted to the face of the chamber 24 at the entrance 21 thereto. The lower edge 48 is complementary to that of the front elevation of the circuit boards to be soldered. The height of the curtain 40 is chosen so that the clearance between the bottom edge 48 and the components to be soldered is in the order of 3 mm. Accordingly, the ingress of air beneath the edge 48 into the chamber 24 is at a rate substantially lower than it would be in the absence of any curtain at the entrance 21. In order to form the shaped lower edge 48 of the plate 42, a front elevation of the circuit board may be drawn to scale, and the resulting drawing used as a template to enable a plate of metallic or non-metallic material to be cut to shape.

The curtain 40 is preferably readily demountable from the chamber 24. Typically, it is desired in one production run to produce a large number of identical circuit boards of a first layout, and then in another production run to produce a large number of circuit boards of a different layout. A different curtain 21 having an appropriately shaped bottom edge 48 (see FIG. 3) may be used for each such production run, with the curtains being changed between production runs.

The curtain 41 shown in FIG. 2 may be of a conventional kind comprising filaments or fingers of fibrous or elastomeric material or of the kind described above with reference to FIG. 3. If desired, a plurality of such curtains may be employed at the exit 23.

In operation, in order to prepare the apparatus 20 for a soldering operation, the vessel 30 is charged with a batch of molten solder (or the solder melted in situ) and the chamber 24 is purged with nitrogen supplied by the distributors 32 and 34 for a period sufficient to reduce the oxygen concentration to a chosen low level. Operation of the pump 28 is then started to create the wave 26 and the conveyer 22 is actuated. Circuit boards to be soldered are then loaded sequentially onto the conveyer belt and are carried through the chamber 24. Each solder board in turn comes into appropriate soldering contact with the wave 26 and the necessary soldered joints are formed. These joints are cooled by the nitrogen supplied from the distributor 34 and have solidified by the time each board leaves the exit 23 of the chamber 24. The nitrogen is supplied to the distributors 32 and 34 from a source external to the chamber 24. The source is preferably a vacuum-insulated vessel (not shown) containing liquid nitrogen of a purity such that it contains less then five volumes per million of oxygen. The vessel is fitted with a vaporizer to evaporate the liquid nitrogen as it passes therethrough.

When using a curtain 40 of the kind shown in FIG. 3, at the entrance 21 to the chamber 4, and a total nitrogen flow rate of 517 liters per minute into the chamber 24, we have been able to achieve oxygen levels of less than 50 ppm in the vicinity of the wave 26, the chamber 24 having a free space in the order of five cubic feet.

Figure 5:
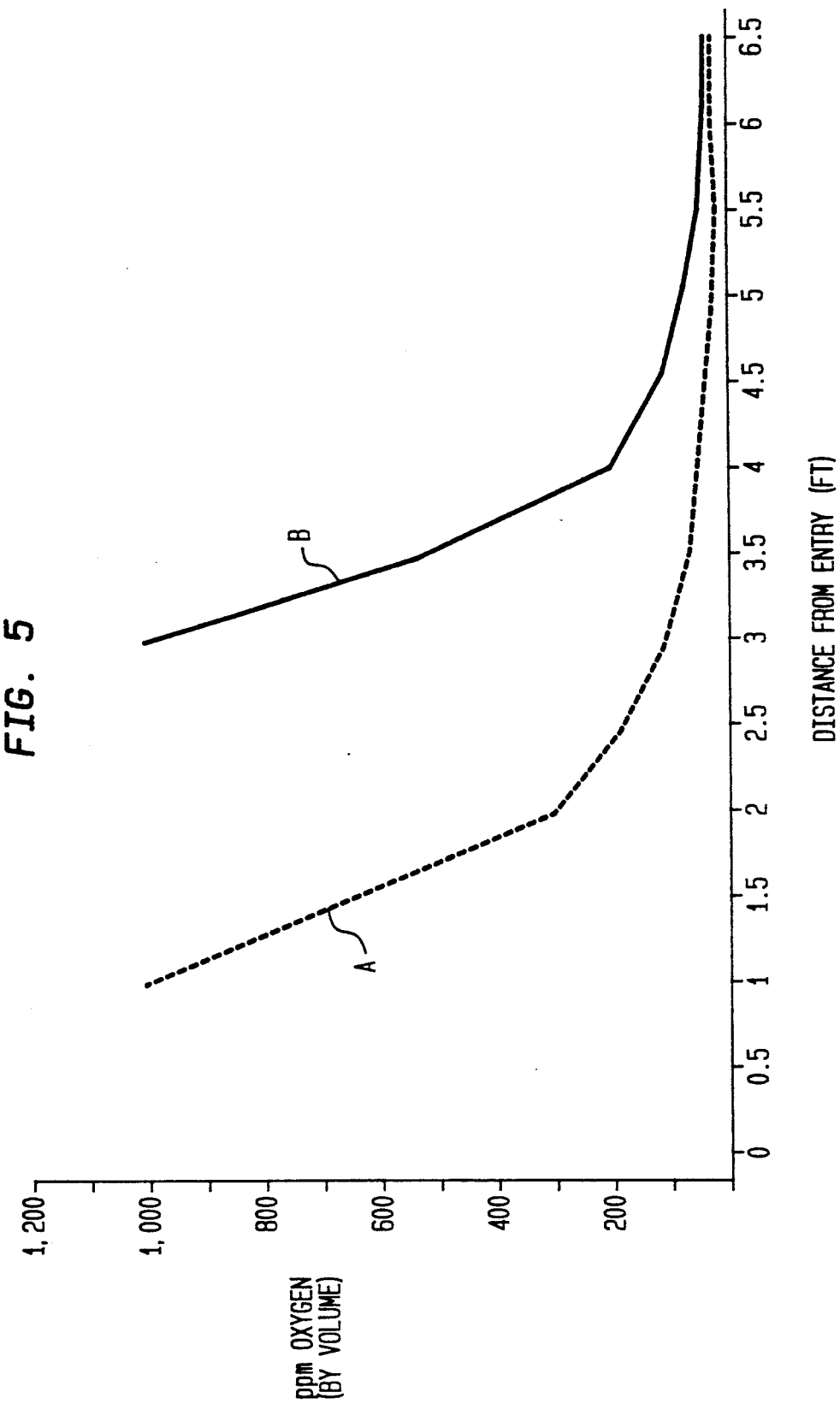
FIG. 5 is a graph illustrating the variation in oxygen concentration along the length of part of a soldering chamber.

The effectiveness of the method and apparatus according to the invention in reducing oxygen levels within the chamber 24 is illustrated by the graph that forms FIG. 5. In this graph the distance from the entry 21 is plotted on the abscissa and the oxygen level in volumes per million is plotted on the ordinate of the graph. Curve B in the graph shows operation without the presence of a curtain at the entrance 21 of the chamber 24. Curve A shows the results obtained when a curtain of the kind shown in FIG. 3 was employed at the entrance 21 of the chamber 24. It can be seen that at, for example, a distance four feet from the entrance 21, the oxygen level, when the chamber was operated in accordance with the invention, was less than 50 volumes per million but when the curtain was omitted, the oxygen level was 200 volumes per million.

Figure 6:
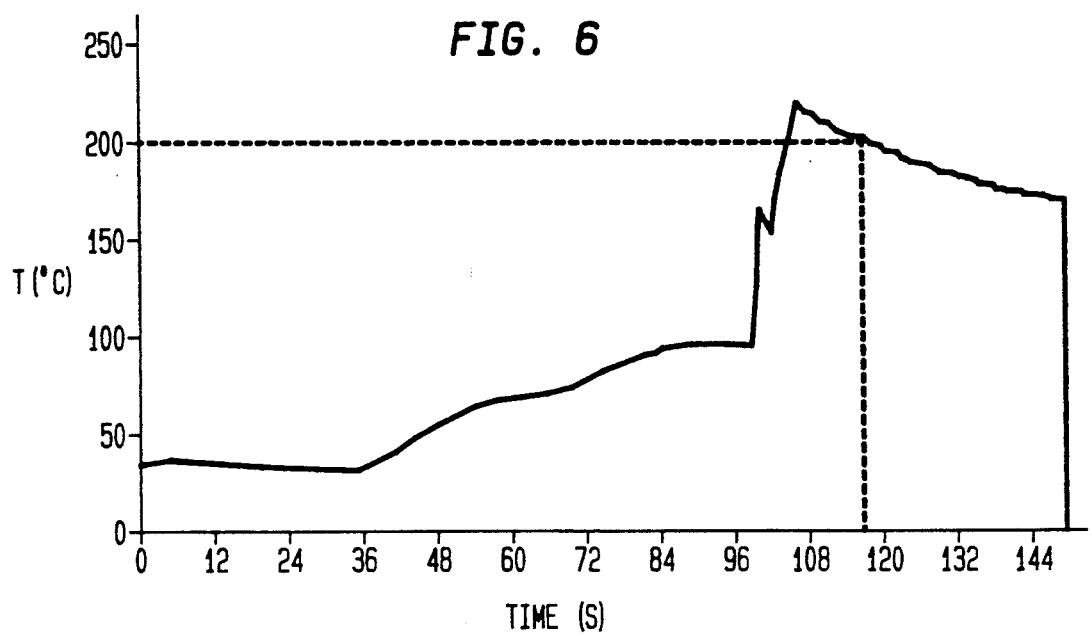
FIGS. 6 and 7 are graphs illustrating the change in temperature of a component mounted on a circuit board as the board is advanced through a soldering chamber chamber, the dashed lines on the graphs connect relevant temperatures and times to facilitate an understanding of the graphs.
Figure 7:
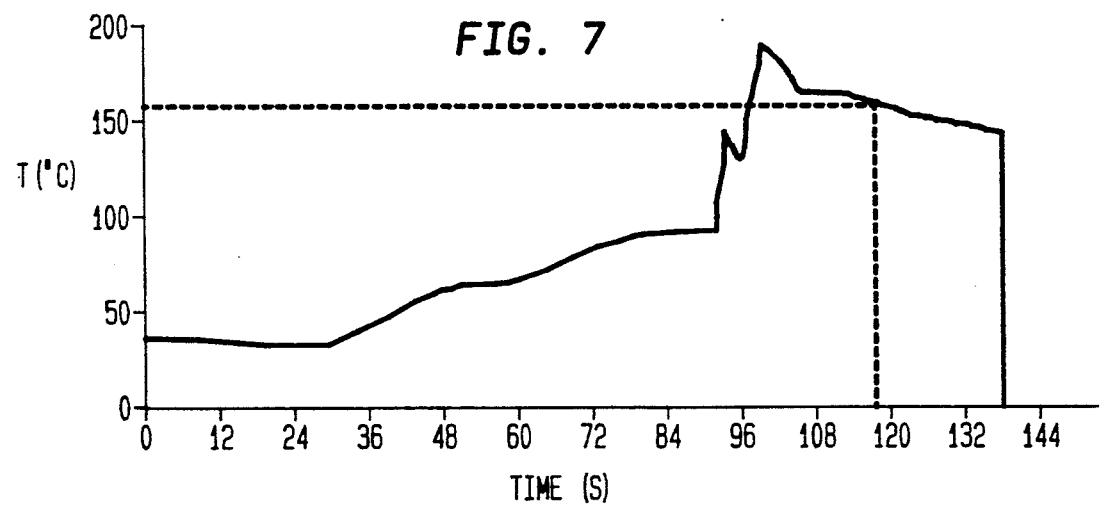

The effectiveness of the distributor 34 in cooling soldered components in operation of the apparatus shown in FIG. 2 is illustrated by FIGS. 6 and 7. In the graphs that form FIGS. 6 and 7, time is plotted along the abscissae and temperature along the ordinates. FIG. 6 illustrates the temperature of a component as it passes through an apparatus of the kind shown in FIG. 2, when both distributors 32 and 34 are of the kind in which nitrogen diffuses into the chamber 24 from a porous surface. The temperature of the component at the curtain at the exit is 200° C. The solder melts in the temperature range of 183° C. to 188° C. Accordingly, the solder has not fully set by the time the circuit board leaves the apparatus, and there is hence a risk of the components being displaced by contact with a conventional curtain at the exit 23. To overcome this problem, a curtain of the kind shown in FIG. 3 may be employed at the exit 23 as well as the entrance 21. Alternatively, a distributor 34 of the kind shown in FIG. 4 may be used to direct nitrogen gas onto the newly soldered components intermediate the solder wave 26 and the exit 23 of the chamber. Such operation is illustrated in FIG. 7. The exit temperature of the soldered component was measured at 162° C., i.e. below the temperature range in which the solder. It will thus be appreciated that the use of coolant streams of nitrogen to reduce the temperature of the soldered components has a considerable effect.

Figure 8:
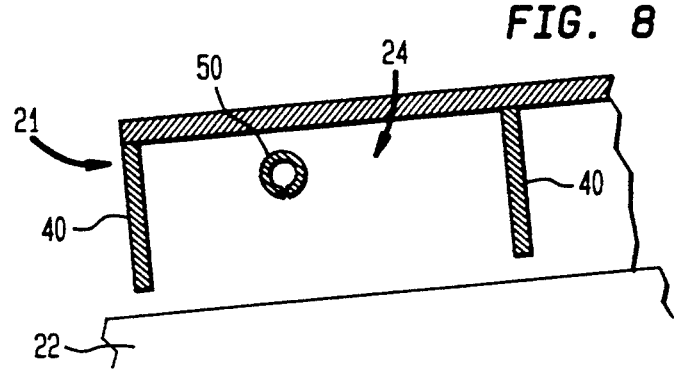
FIG. 8 illustrates an alternative arrangement of curtains to that illustrated in FIG. 3. The drawings are not to scale.

Various additions and modifications may be made to the above described soldering method and apparatus according to the invention. For example, instead of using a single curtain 40 at the entry 21 and/or exit 23 to the furnace, a plurality of spaced apart curtains 40, each of the kind illustrated in FIG. 3 may be employed. Further, nitrogen or other non-oxidizing gas may, as shown in FIG. 8, be supplied through a distributor 50 located between the pair of curtains 40. Using such a curtaining arrangement it becomes possible to reduce even further the oxygen level in the vicinity of the solder wave 26. It is additionally or alternatively possible to fit the furnace with doors to enable the ingress of air to be prevented altogether during periods in which the apparatus is being held on stand-by. For example, the doors may be housed internally within the solder chamber (in a raised position) allowing circuit boards to pass beneath them and then allowed to swing down to seal the chamber during non-productive periods. In a further modification, if there is inadequate sealing between the underside of the conveyer 22 and the chamber 24 at the entrance 21 or the exit 23, or both, appropriate sealing strips or other means may be applied at these locations so as to reduce further the rate of ingress of air into the chamber 24 during a soldering operation.

We claim:

1. A method of soldering an assembled circuit board including: advancing the assembled circuit board through a soldering chamber having an entrance and an exit; providing a substantially non-oxidizing soldering atmosphere within the soldering chamber; and soldering the assembled circuit board within the soldering chamber; the entrance and the exit each having at least one fixed curtain and the at least one fixed curtain located at the entrance to the soldering chamber having a bottom edge shaped complementary to a front elevation of the assembled circuit board to be soldered; and the assembled circuit board being advanced into the soldering chamber by being passed under the bottom edge of the at least one curtain provided at the entrance to the soldering chamber so that components of the assembled circuit board to be soldered just clear said bottom edge without making contact therewith.

2. The method as claimed in claim 1, in which the assembled circuit board is soldered by a wave soldering method.

3. The method as claimed in claim 2, in which the clearance between the the bottom edge and each assembled circuit board is less than 5 mm.

4. The method as claimed in claim 2, in which the substantially non-oxidizing soldering atmosphere is provided by introducing nitrogen into the soldering chamber.

5. The method as claimed in claim 2, in which the substantially non-oxidizing soldering atmosphere is provided within the soldering chamber by introducing a substantially non-oxidizing gas containing no more than 200 volumes per million of oxygen into the soldering chamber.

6. The method as claimed in claim 2, in which the substantially non-oxidizing atmosphere is provided by introducing a substantially non-oxidizing gas containing less than 50 volumes per million of oxygen into the soldering chamber.

7. The method as claimed in claim 6, in which the non-oxidizing gas is introduced into the soldering chamber at a rate of less than 250 chamber volumes per hour.

8. The method as claimed in claim 2, further including directing a substantially non-oxidizing gas at soldered components of the assembled circuit board and at one region of the chamber intermediate the solder wave and the exit of the soldering chamber and over the wave itself.

9. The method as claimed 9 in claim 2, wherein a plurality of the fixed curtains, in a spaced apart relationship with respect to one another, are employed at each of the entrance and the exit of the chamber and a substantially non-oxidizing gas is introduced between the plurality of the fixed curtains.

10. The method as claimed in claim 2, wherein the assembled circuit board has a soldering flux applied to it before being advanced through the chamber.

11. A soldering apparatus for soldering an assembled circuit board including: a soldering chamber having, an entrance and an exit; a conveyor for conducting the assembled circuit board to be soldered through the soldering chamber; an inlet into the soldering chamber for a substantially non-oxidizing gas to create a substantially non-oxidizing atmosphere where, in operation, the soldering is performed; the entrance and the exit to the soldering chamber each having at least one fixed curtain arranged so as to limit the ingress of air into the soldering chamber, the at least one fixed curtain located at the entrance to the soldering chamber having a bottom edge of shape complementary to a front elevation to the assembled circuit board and positioned such that components of the assembled circuit board to be soldered upon entering the soldering chamber, just clear said bottom edge without contacting the at least one fixed curtain located at the entrance of the soldering chamber; and means located within the chamber for soldering the the assembled circuit board.

12. The apparatus as claimed in claim 11, in which the position and height of the at least one fixed curtain at the entrance to the chamber is such that the bottom edge clears the components by less than 5 mm.

13. The apparatus as claimed in claim 11, in which the soldering means comprises being a wave soldering apparatus.

14. The apparatus as claimed in claim 11, further including means for directing a substantially non-oxidizing gas at soldered workpieces.

15. The apparatus as claimed in claim 11, including: a plurality of said fixed curtains in a spaced apart relationship with one another and located at each of the entrance and exit of the soldering chamber; and means for introducing the non-oxidizing gas in between said plurality of the fixed curtains.

* * * * *